United States Patent [19]
Usami et al.

[11] 3,944,931
[45] Mar. 16, 1976

[54] MULTI-CHANNEL FREQUENCY CONVERTER HAVING AUTOMATIC CONTROL

[75] Inventors: Noboru Usami, Hino; Chuichi Sodeyama; Hirozi Shoyama, both of Yokohama, all of Japan

[73] Assignee: Hitachi, Ltd., Japan

[22] Filed: Nov. 14, 1974

[21] Appl. No.: 523,852

[30] Foreign Application Priority Data
Nov. 17, 1973 Japan.............................. 48-129567

[52] U.S. Cl. ................ 325/423; 325/442; 325/453; 325/457; 329/122; 329/137
[51] Int. Cl.² ........................................... H04B 1/16
[58] Field of Search ........... 325/420, 422, 423, 433, 325/435, 452, 453, 457, 308, 309, 442; 329/122–125, 137

[56] References Cited
UNITED STATES PATENTS
3,328,700    6/1967    Chipman............................. 325/457
3,697,885   10/1972    Avins et al.......................... 325/422

*Primary Examiner*—Albert J. Mayer
*Attorney, Agent, or Firm*—Craig & Antonelli

[57] ABSTRACT

A device for frequency-converting multi-channel broadcast signals consists of a local oscillator for generating at a time a single oscillation frequency, a mixer and a frequency discriminator for automatically controlling the oscillation frequency of the local oscillator. The frequency discriminator delivers a dc zero voltage when the frequencies of plural signals applied to the discriminator coincide with those of the carrier waves of the frequency-converted multi-channel broadcast signals. If the frequencies of the plural signals applied to the discriminator differ from those of the carrier waves, the discriminator delivers a dc output voltage whose amplitude depends upon the difference.

4 Claims, 9 Drawing Figures

BACKGROUND OF THE INVENTION

1. Field of the Invention

The present invention relates to a receiver for receiving multi-channel broadcast and more particularly to a frequency converter which enables a VHF or UHF television receiver set to receive television broadcast waves using as their carriers superhigh frequency signals.

2. Description of the Prior Art

Today, the television broadcast uses electromagnetic waves belonging to VHF or UHF band, but the future trend in this field is toward the use of much higher frequencies, e.g. signal waves of SHF band.

In the practice of such a broadcasting service as using SHF band, it is of great economy if the currently used receiver set can be utilized in the reception of the broadcast. For this purpose, there is a need for a frequency converter which, if it is only attached to a conventional television receiver, makes the receiver adaptable for the new broadcast band. Above all, it is necessary to employ in the SHF broadcast the same television signals as the conventional ones and the same modulation system, i.e. vestigial-sideband amplitude modulation, as the one now in practice.

The frequency converter to enable the conventional TV receiver to receive the SHF broadcast, comprises, for example, an antenna for catching the broadcast waves in the air, a local oscillator for generating at a time a single oscillation frequency, a mixer for mixing the signals induced in the antenna and the output of the local oscillator, and an amplifier for amplifying the output, that is, frequency-converted signal, from the mixer. If the antenna catches three kinds of broadcast waves having their respective carrier frequencies $f_1, f_2$ and $f_3$, the amplifier mentioned above will deliver the corresponding three kinds of signals having frequencies $f'_1, f'_2$ and $f'_3$. Therefore, if the oscillation frequency of the local oscillator is so determined as to make the frequencies $f'_1, f'_2$ and $f'_3$ belong to the conventional VHF or UHF band for TV broadcast, the SHF signal can be effectively received by simply connecting the converter with the conventional television receiver set. According to the convention of broadcast, the frequencies $f'_1, f'_2$ and $f'_3$ are so determined as to correspond to the channels to which no broadcast waves are alloted in the district in consideration. The most important thing with such a frequency converter is the stability of the oscillation frequency of the local oscillator. The problem concerning the stability of the oscillation frequency will be described by the use of concrete numerical example.

Let a case be considered in which an SHF broadcast channel having a video carrier frequency $f_1$ of 12,000 MHz is received by converting the SHF channel to the fiftieth channel (video carrier frequency 693.25 MHz) of the present Japanese Standard TV Broadcast System. In this case, the local oscillation frequency $f_l$, assumed to be set lower than the carrier frequency of the SHF channel, is such that $$f_l = 12,000 - 693.25 = 11,306.75 \text{ (MHz)}.$$

The video carrier frequency $f_1$ of the broadcast wave can be considered almost fixed since the broadcast mainly on the deviation of the local oscillation frequency $f_l$, the variation $+\Delta f$ of the frequency $f_l$ causing the variation $-\Delta f$ of the frequency of the output of the converter.

In order to effectively receive television broadcast with conventional receiver sets, the video carrier frequency of the broadcast signal induced in the antenna must be confined within a range of at least the predetermined value $\pm 0.1$ MHz. Accordingly, the local oscillator of the frequency converter must have a frequency stability as high as 0.1/11,306.75, i.e. about $1 \times 10^{-5}$. Such a high frequency stability can be attained by (1) using an oscillator having a high frequency stability, such as quartz or crystal controlled oscillator and (2) automatically controlling the local oscillation frequency in such a manner that the detected deviation of the output frequency is always rendered to zero.

The first method cannot be employed in the television sets for domestic use since the associated device is very complicated and expensive. Moreover, in the present level of technique, even a quartz controlled oscillator having the highest frequency stability attainable will not be able to maintain the above said stability in the circumstances varying in ambient temperature, power source voltage etc.

The second artifice, which has been employed in the domestic TV sets for the reception of VHF and UHF bands, cannot be applied, as it is, to the reception of the SHF television broadcast without encountering technical difficulties and above all without causing too much expense. This is described below.

In order to automatically control the local oscillation frequency, it is necessary to design the local oscillator of the frequency converter so that it may generate in a change-over fashion different frequencies in accordance with the number of the broadcast waves, and to incorporate in the frequency converter mentioned above a frequency discriminator which detects the frequency of the output of the mixer or the output of the amplifier and whose output is fed to the local oscillator to automatically control the oscillation frequency. In such a case, the carrier frequency in the output of the mixer remains to be a fixed value $f_o$ for any channel received since the local oscillation frequency is changed over in accordance with the frequencies of the received signals. Accordingly, the channels to be received are selected by changing over the oscillation frequencies of the local oscillator and the channel selecting device or channel selector of the conventional TV receiver set to which the frequency-converted signals are applied, is adjusted to the frequency $f_o$.

The frequency converter described above has the following drawbacks.

1. Since each of the plural TV broadcast channels will be separated from one another by about 12 MHz, as in the UHF band, the different frequencies generated by the local oscillator must differ from one another by about 12 MHz. As described before, however, the local frequency is to be around 11 GHz and it is technically very difficult to make a difference of 12 MHz with respect to such a high frequency.

2. The condition necessary for the frequency stability proper to the local oscillator can be relaxed due to the use of the automatic frequency control, but the frequency excursion of the oscillator must be limited operations of the control system. Of all the erroneous operations, the one due to the influence of sound carrier takes place most usually. Namely, the frequency discriminator in its normal operation compares the video carrier frequency with the associated fixed value $f_o$, but when the excursion of the local oscillation frequency exceeds a certain limit, the frequency discriminator will compare the value $f_o$ with the sound carrier frequency so that the control system operates erroneously. It is known from this that the allowable breadth of the excursion of the local oscillation frequency is about half (i.e. 2.3 MHz) the difference (4.5 MHz) between the video and the sound carrier frequencies. The breadth of 2.3 MHz is about 20 times the value 0.1 MHz obtained above in the absence of frequency control. The frequency stability in this case is $2 \times 10^{-4}$ and this is a much relaxed condition in comparison with the previously obtained value of $1 \times 10^{-5}$. In order to maintain the improved value under various conditions, however, the local oscillator must be provided with some auxiliary stabilizing means. Thus, under these circumstances, the local oscillator for generating not a single frequency but plural ones in change-over manner will add considerably to technical difficulties.

3. As described above, the conventional TV receiver sets are utilized in the reception system using such a frequency converter as enlarged upon above. Since the receiver set has a channel selector, the separate provision of a channel selecting function in the converter will cause an operative complexity and above all be uneconomical.

SUMMARY OF THE INVENTION

A first object of the present invention is to provide a frequency converter well adapted for the reception of the television broadcast in superhigh frequency band.

A second object of the present invention is to provide a frequency converter well adapted for the reception of the multi-channel television broadcast in superhigh frequency band.

A third object of the present invention is to provide a frequency converter which can be easily manipulated and is suitable for domestic use and well adapted for the reception of the superhigh frequency band television broadcast.

A fourth object of the present invention is to provide a frequency converter in which the frequency of the local oscillator can be securely and automatically controlled even in case where the converted signal contains a plurality of carrier signals having different frequencies.

According to the present invention, in order to attain the above said objects, the local oscillator generates at a time a single frequency and a specifically designed frequency discriminator is used as a circuit to detect frequencies for automatic frequency control, which discriminator delivers a zero output voltage for a plurality of predetermined frequencies and provides repeatedly frequency discriminating characteristics for the variation in the frequency.

The frequency discriminator is constituted by a means for delaying an input signal by a time $\tau$ and shifting the phase of the input signal by $\phi$ radians; a means for delaying an input signal by a time $\tau/2$ and shifting the phase of the signal by $\phi/2$ radians; a first adding means for adding an input signal to the signal having a delay time of $\tau$ and a phase shift of $\phi$ radians; adding means to the signal having a delay time of $\tau/2$ and a phase shift of $\phi/2$ radians; a first subtracting means for making a difference between the output of the first adding means and a signal having a delay time of $\tau/2$ and a phase shift of $\phi/2$ radians; a means for rectifying the output of the second adding means; a means for rectifying the output of the first subtracting means; and a second subtracting means for making a difference between the outputs of the first and second rectifying means.

DESCRIPTION OF THE PREFERRED EMBODIMENT

Figure 1:
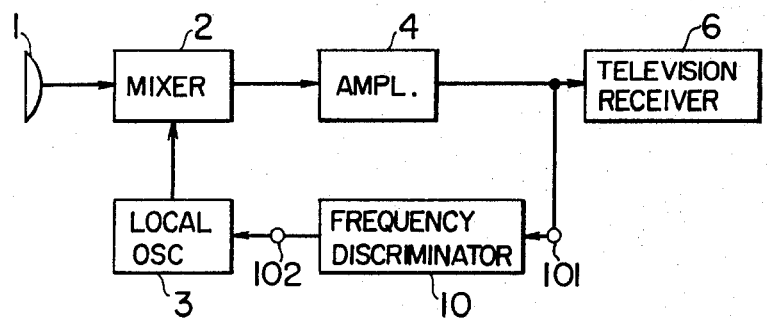
FIG. 1 is a system block diagram showing schematically one embodiment of the present invention.
Figure 2A:
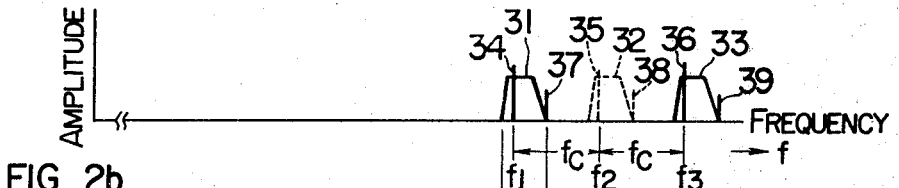
FIGS. 2a to 2c are frequency spectra for the explanation of frequency converting operation.

FIGS. 1 and 2 show respectively the schematic block diagram of the present invention and the sketches of frequency spectra useful for the explanation of frequency converting operation. The SHF television broadcast signal caught by an antenna 1 is fed to a mixer 2. The TV signal has, for example, a frequency spectrum as shown in FIG. 2a. Trapezoids 31, 32 and 33 indicate three broadcast channels used in a certain district, vertical line segments 34, 35 and 36 the associated video carriers, and vertical line segments 37, 38 and 39 the associated sound carriers. The frequencies of the video carriers 34, 35 and 36 are designated respectively by $f_1$, $f_2$ and $f_3$. These frequencies are chosen to be within a band of, for example, 11.7 to 12.2 GHz. The frequency band width $f_B$ occupied by each of the channels is determined to be, for example, 6 MHz while the channel interval $f_c$ of the respective channels is chosen to be 12 MHz. The frequencies of the sound carriers 37, 38 and 39 are higher by 4.5 MHz than those of the video carriers $f_1$, $f_2$ and $f_3$, respectively. Namely, the system now in consideration is the same as the television broadcast system except that the video carriers are in superhigh frequency band. In the above description, it is assumed that the number of the broadcast channels is three, but it should be noted that the greater is the number, the more effective is the present invention. Moreover, each channel is independent of the others and all the channels may not be occupied, that is, some channels may be vacant of transmitted signal. The channel 32 represented by dotted line in FIG. 2a means such a vacant channels.

Figure 2B:
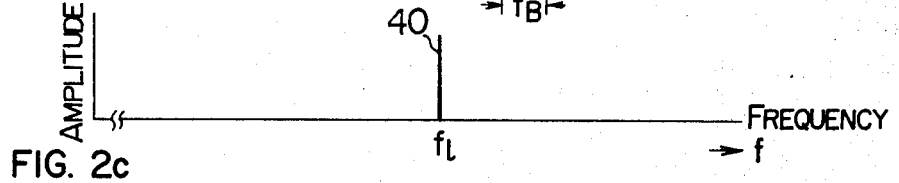
Figure 2C:
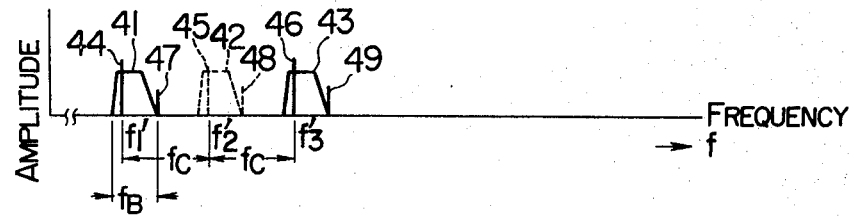

The mixer 2 receives besides the SHF broadcast signals caught by the antenna a local oscillation signal (having a frequency $f_l$) generated by a local oscillator 3 and indicated by a vertical line segment 40 in FIG. 2b, and delivers an output having a frequency component that is the difference between the SHF broadcast signal frequency and the local oscillation frequency. FIG. 2c shows the frequency spectrum of the output of the mixer 3. In FIG. 2c, trapezoids 41, 42 and 43 indicate the frequency-converted versions of the broadcast channels 31, 32 and 33, vertical line segments 44, 45, 46 the frequency-converted versions of the video carriers 34, 35 and 36, and vertical line segments 47, 48 and 49 the frequency-converted versions of the sound carriers 37, 38 and 39. The frequency-converted video carriers 44, 45 and 46 respectively have frequencies $f'_1, f'_2$ and $f'_3$, which equal $f_1, f_2$ and $f_3$, minus the local oscillation frequency $f_l$. The channel breadth and the channel interval are maintained unaltered even after frequency conversion and respectively equal $f_B$ and $f_c$. The local oscillation frequency $f_l$ is so selected that $f'_1, f'_2$ and $f'_3$ may coincide with the frequencies of the currently used video carriers in the UHF broadcast band.

Figure 3:
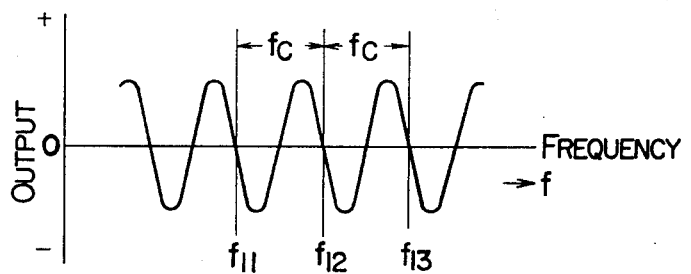
FIG. 3 graphically shows the frequency characteristic of a frequency discriminator used in the present invention.

The output of the mixer 2 is amplified by a wide-band amplifier 4 and the output of the amplifier 4 is fed to a conventional television receiver 6, which in turn selects a channel for reception of broadcast. A part of the output of the amplifier 4 is applied also to the input terminal 101 of a frequency discriminator 10. The frequency discriminator 10 delivers a zero output voltage at its output terminal 102 when the frequency of the signal applied to the input terminal 101 coincides with one of predetermined frequencies, but otherwise a positive or negative voltage at the output terminal 102 whose amplitude depends on the difference between the frequency of the signal applied to the terminal 101 and the predetermined frequency. The frequencies predetermined in the frequency discriminator 10 have the same channel interval $f_c$ as shown in FIG. 2c and coincide with the video carrier frequencies of the conventional VHF or UHF band broadcast waves. Namely, the relationship between the input frequency and the output voltage, of the frequency discriminator 10 is represented by such a characteristic as shown in FIG. 3. The predetermined frequencies for the frequency-converted video carriers are designated by $f_{11}, f_{12}$ and $f_{13}$, which are adjusted to coincide with the video carrier frequencies of the reception channels of the television receiver 6. The frequency interval of these frequencies $f_{11}, f_{12}$ and $f_{13}$ is set equal to the channel interval $f_c$ of the SHF broadcast signals.

Figure 4:
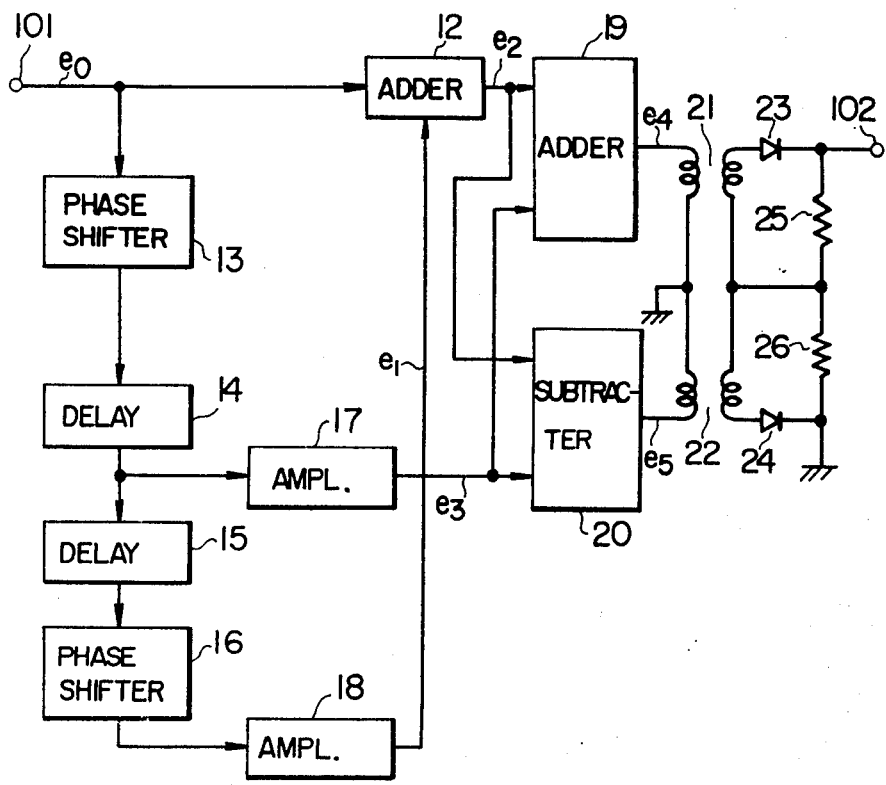
FIG. 4 is a block diagram of a first embodiment of a frequency discriminator utilized in the system block diagram of the present invention of FIG. 1.

Now, a concrete structure of the frequency discriminator 10 will be described with reference to FIG. 4 showing in block diagram a frequency discriminator as a first embodiment of the present invention. To the input terminal 101 is applied the output of the wide-band amplifier 4 shown in FIG. 1. The output branches off to an adder 12 and to a phase shifter 13. The output of the phase shifter 13 is passed through a delay circuit 14 and then branches off to an amplifier 17 and to a delay circuit 15. The output of the delay circuit 15 is fed via a phase shifter 16 to an amplifier 18. The phase shifters 13 and 16 provide the same phase shift within the range of the frequencies of the signals processed. The delay circuits 14 and 15 also have the same delay time. The signal passed through the delay circuits 14 and 15 and the phase shifters 13 and 16 and amplified by the amplifier 18, is applied to the adder 12 and added there to the input signal applied directly to the adder 12.

Here, it is assumed to facilitate the understanding of the operation, that the input signal at the terminal 101 is a simple sinusoidal wave represented by the formula:

$$e_o = E_o \sin \omega t \tag{1}$$

Provided that the delay circuits 14 and 15 have a delay time of $\tau/2$ irrespective of the frequency of the signal applied thereto and that the phase shifters 13 and 16 cause a phase shift of $\phi/2$ independent of the frequency of the signal passing through them, the amplifier 18 delivers at its output terminal an output signal $e_1$ such that $$e_1 = E_1 \sin [\omega(t - \tau) - \phi] \tag{2}$$

On the other hand, the voltage applied to the first input terminal of the adder 12 is $e_o$ represented by the formula (1) so that the sum of $e_1$ and $e_o$ appears at the output of the adder 12. Let the synthesized voltage be represented by $e_2$, and $e_2$ is such that $$e_2 = e_o + e_1 \tag{3}$$

If the gain of the amplifier 18 is so set as to make the amplitude $E_1$ of the signal $e_1$ equal to the amplitude $E_o$ of the signal $e_o$, the signal $e_2$ is given by the formula:

$$e_2 = 2E_o \sin[\omega t - \tfrac{1}{2}(\omega\tau + \phi)] \times \cos \tfrac{1}{2}(\omega\tau + \phi) \tag{4}$$

Figure 5:
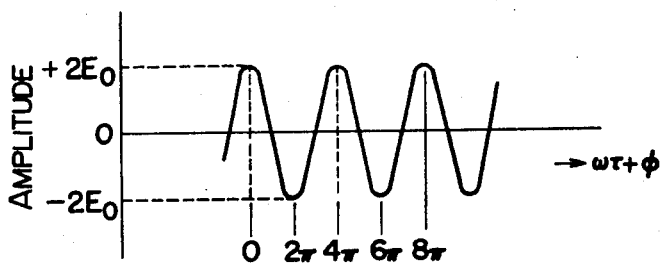
FIGS. 5 to 7 show curves representing frequency vs. voltage characteristics for the explanation of the operation of the circuit shown in FIG. 4.

As apparent from the above formula, the amplitude of $e_2$ varies with the phase angle $(\omega\tau + \phi)$ including an angular frequency $\omega$, as shown in FIG. 5.

The output of the adder 12 is applied to both one of the input terminals of an adder 19 and one of the input terminals of a subtracter 20. To the other input terminal of the adder 19 and the other input terminal of the subtracter 20 is applied the input signal which has been passed through the phase shifter 13 and the delay circuit 14 and amplified by an amplifier 17. Let the signal delivered by the amplifier 17 be represented by $e_3$, and the signal $e_3$ is given by the following formula:

$$e_3 = E_3 \sin[\omega(t - \tau/2) - \phi/2] \tag{5}$$

Accordingly, the outputs $e_4$ and $e_5$ of the adder 19 and the subtractor 20 are given as follows:

$$e_4 = e_2 + e_3 \tag{6}$$

$$e_5 = e_2 - e_3 \tag{7}$$

If the gain of the amplifier 17 is adjusted such that $$E_3 = 2E_o \tag{8},$$

the outputs $e_4$ and $e_5$ are given by the following formulas:

$$e_4 = E_o[\cos \tfrac{1}{2}(\omega\tau + \phi) + 1] \times \sin[\omega t - \tfrac{1}{2}(\omega\tau + \phi)] \tag{9}$$

$$e_5 = 2E_o[\cos \tfrac{1}{2}(\omega\tau + \phi) - 1] \times \sin[\omega t - \tfrac{1}{2}(\omega\tau + \phi)] \tag{10}$$

Figure 6:
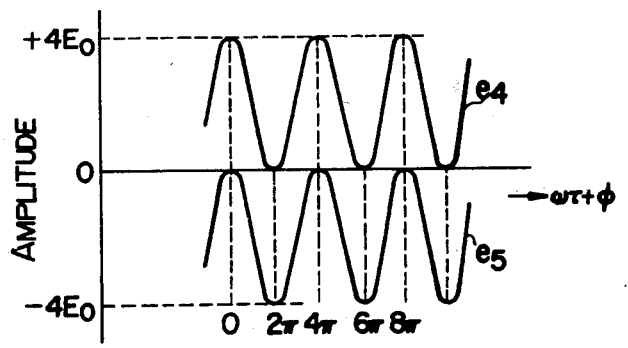

The variations of the amplitudes of the signals $e_4$ and $e_5$ with respect to the phase angle $(\omega\tau + \phi)$ are as shown in FIG. 6.

The voltages $e_4$ and $e_5$ are respectively applied via transformers 21 and 22 to rectifiers 23 and 24 so that $dc$ voltages $E_4$ and $E_5$ corresponding to the $e_4$ and $e_5$ are developed across resistors 25 and 26. The $dc$ voltages $E_4$ and $E_5$ are given by the following formulas:

$$E_4 = k[1 + \cos \tfrac{1}{2}(\omega\tau + \phi)] \tag{11}$$

$$E_5 = k[1 - \cos \tfrac{1}{2}(\omega\tau + \phi)] \tag{12},$$

where $k$ is a constant.

Since the output voltage $\Delta E$ developed between the output terminal 102 of the frequency discriminator and the earth is the difference between $E_4$ and $E_5$, as apparent from FIG. 4, then it follows that $$\Delta E \approx 2k \cos \tfrac{1}{2}(\omega\tau + \phi) \qquad (13)$$

Figure 7:
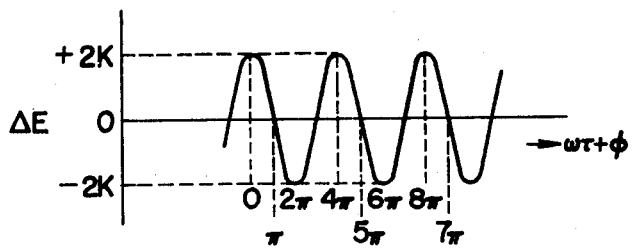

The variation of $\Delta E$ with respect to the phase angle ($\omega\tau + \phi$) is as shown in FIG. 7. As seen from FIG. 7, the voltage $\Delta E$ varies sinusoidally with a period of $4\pi$. In the present invention, the delay time $\tau/2$ of the delay circuit 14 or 15 is determined such that $$\frac{\tau}{2} = \frac{1}{f_c} \qquad (14),$$

where $f_c$ is the channel interval as described with FIG. 2. Since the channel interval $f_c$ is 12 MHz, the delay $\tau/2$ is about 83 nsec. The formula (13) is therefore transformed into $$\Delta E = 2k \cos (2\pi f/f_c + \phi/2) \qquad (15),$$

where $\omega = 2\pi f$.

As seen from the formula (15), the voltage $\Delta E$ varies sinusoidally with $f$, at a period equal to $f_c$.

Now, the frequency $f_{11}$ predetermined for the channel 41 in FIG. 2 in the frequency converter in FIG. 1 can be expressed by the use of $f_c$, as follows.

$$f_{11} = nf_c + f_a \qquad (16),$$

where $n$ is a positive integer and $f_a < f_c$. Accordingly, the predetermined frequencies $f_{12}$ and $f_{13}$ for the other channels 42 and 43 can also be expressed as follows.

$$f_{12} = (n+1)f_c + f_a,\ f_{13} = (n+2)f_c + f_a.$$

The value of $\Delta E$ for the input frequency $f_{11}$ can be obtained by substituting $f_{11}$ in the formula (16) for $f$ in the formula (15), the result being such that $$\Delta E = 2k \cos(2\pi \cdot n + 2\pi f_a/f_c + \phi/2) \qquad (17)$$

Therefore, if the phase shift $\phi/2$ of the phase shifters 13 and 16 is so determined as to satisfy the condition:

$$2\pi f_a/f_c + \phi/2 = (4m+1) \cdot \frac{\pi}{2} \qquad (18),$$

where $m$ is zero or unity, then there is obtained a frequency discriminating characteristic in which $\Delta E$ vanishes for the input of $f_{11}$ and decreases with the increase in frequency in the neighborhood of $f_{11}$. In this way, it is apparent that $\Delta E$ provides a desired characteristic of frequency discrimination even for the frequencies $f_{12}$ and $f_{13}$. Thus, the characteristic of frequency discrimination as shown in FIG. 3 can be realized by the circuit as shown in FIG. 4.

The phase shifters 13 and 16 described above have only to provide approximately equal phase shifts within the range of frequencies to be processed, i.e. a band of 36 MHz in case where the number of the broadcast channels is three and the frequency interval is 12 MHz, so that conventional phase shifters can be used to play the roles of the phase shifters 13 and 16. It is known from this that in case of a multiplicity of broadcast channels being used, the frequencies of the frequency-converted signals preferably belong to the UHF band.

In the above description, the input signals to the frequency discriminator 10 is assumed to be a single sinusoidal wave, but in the actual reception of broadcast the signals of plural channels having different frequencies are applied to the discriminator 10, as shown in FIG. 2. In the circuit shown in FIG. 4, the part from the input terminal 101 to the transformer 22 is a so-called linear circuit, which responds independently to the signals having different frequencies. Since, on the other hand, the rectifiers 23 and 24 are nonlinear elements, the modulating actions among the plural signals take place in these elements. However, an appropriate design of the constants in the rectifier circuit can sufficiently reduce the mutual modulating actions so that each signal may be regarded as rectified independently. Accordingly, the oscillation frequency of the local oscillator 3 can be automatically controlled to be a predetermined value, by feeding the output voltage of the frequency discriminator 10 back to the local oscillator 3.

For the delay circuits 14 and 15 which are the important constituents of the frequency discriminator 10 can be used usually either ultrasonic delay elements using the time of the propagation of ultrasonic vibrations through medium such as glass or coaxial cables using the times of the propagation of electromagnetic waves therethrough. In such cases, the circuit structures can be simplified if an artifice to propagate the waves in both ways (i.e. in a reflective manner) through the medium, is employed.

Figure 8:
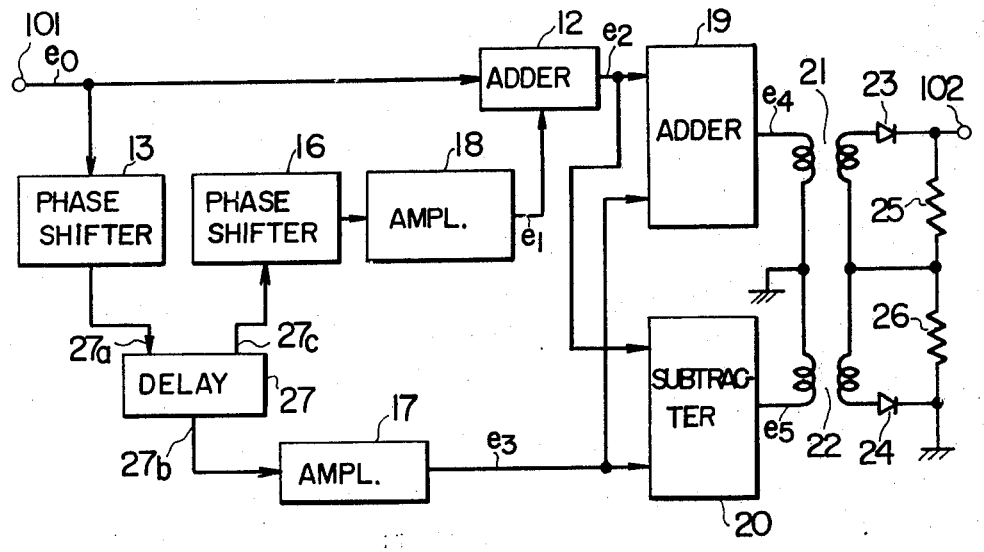
FIG. 8 is a block diagram of a second embodiment of a frequency discriminator utilized in the system block diagram of the present invention of FIG. 1.

FIG. 8 shows a control structure of a frequency discriminator as a second embodiment of the present invention. In this embodiment, only one delay circuit 27 is used in place of two. Namely, the signal applied to the input terminal of the delay circuit is reflected from the output end of the delay circuit to travel backward. The delay circuit 27 is equivalent to the combined role of the delay circuits 14 and 15. The terminal 27a is for the input signal to excite the delay circuit 27. The input signal, after it has traveled a forward path in the delay circuit 27, is partially taken out through the output terminal 27b. The terminal 27b plays the same role as the output terminal of the delay circuit 14 in the previous embodiment shown in FIG. 4 and it is from this terminal 27b that the output voltage corresponding to $e_3$ is derived. Most part of the signal having traveled its forward path is reflected at the end of the delay medium and returns backward to appear at the output terminal 27c. The output voltage appearing at the terminal 27c is applied via a phase shifter 16 to an amplifier 18. It will be needless to say that the output of the amplifier 18 is coincident with the previously mentioned voltage $e_1$. It is a matter of course that the delay time for a single way of the delay circuit 27 is adjusted to be $\tau/2$ while that for double ways is made equal to $\tau$. The remaining parts of FIG. 8 are the same as those of FIG. 4 so that the detailed description of operation is omitted. For the details, just refer to the description regarding the circuit shown in FIG. 4.

We claim:

1. A frequency converter for receiving multi-channel broadcast waves and for converting the frequencies of the carriers of said multi-channel broadcast waves, comprising:

a local oscillator whose oscillation frequency is changed through the application of a control voltage thereto;

a mixer for mixing said received waves with the output of said local oscillator for the frequency convertion of said broadcast waves;

a frequency discriminating circuit having alternately repeated frequency discriminating characteristics, to which the output of said mixer is applied, which delivers zero dc voltages whenever the carrier frequencies in said output of said mixer coincide with predetermined reference frequencies separated from one another by a constant interval in terms of frequency, and which delivers a dc voltage whose amplitude changes depending upon the difference between one of said carrier frequencies and the corresponding one of said reference frequencies when said one of said carrier frequencies does not coincide with said corresponding one of said reference frequencies, said frequency discriminating circuit including a first means for shifting the phase of an input signal by $\phi/2$ radians and for delaying said input signal by a time of $\tau/2$;

a second means for shifting the phase of the output of said first means by $\phi$ radians and for delaying said output signal by $\tau$;

a first adding means for adding said input signal to the output of said second means;

a second adding means for adding the output of said first means to the output of said first adding means;

a subtracting means for making a difference between said output of said first means and said output of said first adding means;

a first rectifying means for rectifying the output of said second adding means;

a second rectifying means for rectifying the output of said subtracting means; and a means for delivering a voltage corresponding to the difference between the outputs of said first and second rectifying means; and a means for automatically controlling said local oscillation frequency by applying the dc output voltage of said frequency discriminator to said local oscillator so as to control said local oscillator.

2. A frequency converter for receiving multi-channel broadcast waves and for converting the frequencies of the carriers of said multi-channel broadcast waves, comprising:

a local oscillator whose oscillation frequency is changed through the application of a control voltage thereto;

a mixer for mixing said received waves with the output of said local oscillator for the frequency convertion of said broadcast waves;

a frequency discriminating circuit having alternately repeated frequency discriminating characteristics, to which the output of said mixer is applied, which delivers zero dc voltages whenever the carrier frequencies in said output of said mixer coincide with predetermined reference frequencies separated from one another by a constant interval in terms of frequency, and which delivers a dc voltage whose amplitude changes depending upon the difference between one of said carrier frequencies and the corresponding one of said reference frequencies when said one of said carrier frequencies does not coincide with said corresponding one of said reference frequencies, said frequency discriminating circuit including a means for dividing an input signal into two portions;

a first adder which receives one of said two portions at one of its input terminals;

a first phase shifter which receives the other of said two portions and shifts the phase thereof by $\phi/2$ radians;

a delay circuit having a delay element with a delay time of $\tau/2$, an input terminal and first and second output terminals, an input signal being applied through said input terminal to said delay element, a first signal delayed through said delay element by a time $\tau/2$ with respect to said input signal being delivered at said first output terminal, and a second signal which is reflected at the output end of said delay element, travels double ways through said element, and has a delay time of $\tau$ with respect to said input signal, being delivered at said second output terminal;

a means for applying the output of said first phase shifter to said input terminal of said delay circuit;

a second phase shifter for receiving said second signal delivered at said second terminal of said delay circuit and for shifting the phase of said second signal by $\phi/2$ radians;

a first amplifier for amplifying the output of said second phase shifter;

a means for applying the output of said first amplifier to the other input terminal of said first adder;

a second amplifier for receiving said first signal delivered at said first output terminal of said delay circuit;

a second adder for adding the output of said first adder to the output of said second amplifier;

a subtracter for making a difference between said output of said first adder and said output of said second amplifier;

a first rectifying circuit for rectifying the output of said second adder;

a second rectifying circuit for rectifying the output of said subtracter; and a subtracting means for obtaining a voltage corresponding to the difference between the outputs of said first and second rectifying circuits; and a means for automatically controlling said local oscillation frequency by applying the dc output voltage of said frequency discriminator to said local oscillator so as to control said local oscillator.

3. A frequency converter for receiving multichannel broadcast waves and for converting the frequencies of the carriers of said multi-channel broadcast waves, comprising:

means for generating a single local oscillation signal, the frequency of said local oscillation signal being variable by a control voltage fed to said local oscillation signal generating means;

means for mixing said received waves with said local oscillation signal to deliver the corresponding broadcast waves at converted frequencies;

means for simultaneously discriminating a plurality of frequencies, said discriminating means including delay means for delaying an input signal thereto to deliver a first delayed signal, and a second delayed signal, means for adding said input signal to said delay means and said second delayed signal, and means for generating signals representative of a sum of the output of said adding means and said first delayed signal and a difference between the output of said adding means and said first delayed signal, respectively, and means for rectifying said sum and difference to deliver the corresponding sum and difference signals; and means for supplying said frequency discriminating means with all of said waves frequency-converted by said mixing means and for supplying said local oscillation signal generating means with the output of said frequency discriminating means as a control signal to automatically control the frequency of the output of said local oscillation signal generating means.

4. A frequency converter according to claim 3, wherein said delay means of said frequency discriminating means includes a first delay means for delaying the input signal thereto to deliver the first delayed signal and a second delay means for further delaying said first delayed signal to deliver a second delayed signal.

* * * * *